United States Patent
Hsu et al.

(10) Patent No.: US 11,811,321 B2
(45) Date of Patent: Nov. 7, 2023

(54) SWITCHING POWER CONVERTER CIRCUIT, CLOCK GENERATOR CIRCUIT AND CLOCK GENERATION METHOD HAVING SPREAD SPECTRUM

(71) Applicant: Richtek Technology Corporation, Zhubei (TW)

(72) Inventors: Chen-Lin Hsu, Taoyuan (TW); Chia-Chun Lee, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 71 days.

(21) Appl. No.: 17/736,374

(22) Filed: May 4, 2022

(65) Prior Publication Data

US 2022/0360173 A1 Nov. 10, 2022

Related U.S. Application Data

(60) Provisional application No. 63/255,409, filed on Oct. 13, 2021, provisional application No. 63/183,743, filed on May 4, 2021.

(30) Foreign Application Priority Data

Dec. 23, 2021 (TW) .................................. 110148542

(51) Int. Cl.
*H02M 3/158* (2006.01)
*H03K 3/017* (2006.01)
(Continued)

(52) U.S. Cl.
CPC .......... *H02M 3/158* (2013.01); *H02M 1/0041* (2021.05); *H03K 3/017* (2013.01); *H02M 3/33523* (2013.01)

(58) Field of Classification Search
CPC .. H02M 3/158; H02M 3/1582; H02M 3/1586; H02M 3/33523; H02M 3/33546;
(Continued)

(56) References Cited

U.S. PATENT DOCUMENTS

| | | | |
|---|---|---|---|
| 2007/0194817 A1* | 8/2007 | Decker | H03K 5/156 327/141 |
| 2017/0005647 A1* | 1/2017 | Pan | H02M 3/33507 |
| 2021/0376715 A1* | 12/2021 | Madala | G06F 1/26 |

* cited by examiner

*Primary Examiner* — Nguyen Tran
(74) *Attorney, Agent, or Firm* — Tung & Associates

(57) ABSTRACT

A spread spectrum switching power converter circuit includes: a power stage circuit which includes an inductor and a power switch and is configured to switch the power switch according to a switching signal having spread spectrum for power conversion; a variable frequency oscillator, which generates a spread spectrum clock signal according to a spread spectrum control signal; a spread spectrum control circuit, which generates the spread spectrum control signal according to a first clock signal and a second clock signal; and a pulse width modulation circuit, configured to generate the switching signal according to a feedback signal based on the spread spectrum clock signal. The spread spectrum control circuit generates the spread spectrum control signal by sampling and combining a periodic waveform and a random waveform. The random waveform is generated according to the first clock signal and the periodic waveform is generated according to the second clock signal.

33 Claims, 18 Drawing Sheets

(51) Int. Cl.
*H02M 1/00* (2006.01)
*H02M 3/335* (2006.01)

(58) Field of Classification Search
CPC .... H02M 3/157; H02M 3/156; H02M 3/1563; H02M 1/0041; H02M 1/0003; H03K 3/017; H03K 3/02
See application file for complete search history.

|  | Pseudo Random Waveform | Triangular Waveform + Pseudo Random Waveform | Sawtooth Waveform + Pseudo Random Waveform | Triangular Waveform + Pseudo Random Waveform (Sampling Period n=8) | Sawtooth Waveform + Pseudo Random Waveform (Sampling Period n=8) |
|---|---|---|---|---|---|
| Baseband (dB) | 4.16 | 2.94 | 2.5 | 2.77 | 2.33 |
| Third Degree Harmonic Wave | -8.78 | -10.99 | -12.68 | -11.87 | -12.92 |
| Fifth Degree Harmonic Wave | -17.49 | -18.03 | -19.82 | -18.77 | -19.32 |

Fig. 17

SWITCHING POWER CONVERTER CIRCUIT, CLOCK GENERATOR CIRCUIT AND CLOCK GENERATION METHOD HAVING SPREAD SPECTRUM

CROSS REFERENCE

The present invention claims priority to U.S. 63/183,743 filed on May 4, 2021, claims priority to U.S. 63/255,409 filed on Oct. 13, 2021, and claims priority to TW 110148542 filed on Dec. 23, 2021.

BACKGROUND OF THE INVENTION

Field of Invention

The present invention relates to a switching power converter circuit; particularly, it relates to such switching power converter circuit capable of effectively enhancing spread spectrum performance and expanding the applicable range of the spread spectrum frequencies. The present invention also relates to a clock generator circuit and a clock generation method capable of generating spread spectrum.

Description of Related Art

Please refer to FIG. 1A and FIG. 1B. FIG. 1A and FIG. 1B show modulation waveform diagrams according to a conventional spread spectrum modulation method, wherein FIG. 1A executes a spread spectrum operation upon a switching frequency Fsw by adopting a sawtooth waveform, whereas, FIG. 1B executes a spread spectrum operation upon a switching frequency Fsw by adopting a triangular waveform, wherein a variation of the switching frequency Fsw is equal to Δf. Please refer to FIG. 2, which shows a modulation waveform diagram according to another conventional spread spectrum modulation method, wherein FIG. 2 executes a spread spectrum operation upon a switching frequency Fsw by adopting a pseudo random waveform.

The prior art spread spectrum modulation method shown in FIG. 1A, FIG. 1B and FIG. 2 have following drawbacks. The prior art spread spectrum modulation methods shown in FIG. 1A and FIG. 1B belong to a periodic analog type spread spectrum modulation method, which has a relatively good performance only in a frequency band of 150 kHz to 30 MHz. The prior art spread spectrum modulation method shown in FIG. 2 belongs to a frequency hopping type spread spectrum modulation method, which has a relatively good performance only in a frequency band of 30 MHz to 1 GHz. These two types of prior art spread spectrum modulation methods cannot be applicable to both low frequency band and high frequency band.

In view of the above, to overcome the drawbacks in the prior art, the present invention proposes a switching power converter, a clock generator circuit and a clock generation method capable of effectively enhancing spread spectrum performance and expanding the applicable range of the spread spectrum frequencies.

SUMMARY OF THE INVENTION

From one perspective, the present invention provides a spread spectrum switching power converter circuit, comprising: a variable frequency oscillator, which is configured to operably generate a spread spectrum clock signal having a spread spectrum according to a spread spectrum control signal, wherein the spread spectrum clock signal has a fundamental frequency, and wherein under control of the spread spectrum control signal, the spread spectrum clock signal has a switching frequency variation; a spread spectrum control circuit, which is configured to operably generate the spread spectrum control signal according to a first clock signal and a second clock signal; and a pulse width modulation (PWM) circuit, which is configured to operably generate a switching signal having the spread spectrum according to a feedback signal and based on the spread spectrum clock signal; wherein the switching signal is configured to operably control a power stage circuit, wherein the power stage circuit includes: an inductor and at least one power switch which are coupled to each other, wherein the power stage circuit is configured to operably switch the power switch according to the switching signal having the spread spectrum, so as to execute power conversion; wherein the spread spectrum control circuit includes: a periodic waveform generator, which is configured to operably generate a periodic waveform according to the second clock signal; a random waveform generator, which is configured to operably generate a random waveform according to the first clock signal; and a computation unit, which is configured to sample the random waveform and the periodic waveform, so as to compute to generate the spread spectrum control signal.

From another perspective, the present invention provides a clock generator circuit, which is configured to operably generate a spread spectrum clock signal having a spread spectrum according to a first clock signal and a second clock signal, wherein the spread spectrum clock signal has a fundamental frequency, and wherein under control of the spread spectrum control signal, the spread spectrum clock signal has a switching frequency variation; the clock generator circuit comprising: a variable frequency oscillator, which is configured to operably generate a spread spectrum clock signal having a spread spectrum according to a spread spectrum control signal; and a spread spectrum control circuit, which is configured to operably generate the spread spectrum control signal according to the first clock signal and the second clock signal; wherein the spread spectrum control circuit includes: a periodic waveform generator, which is configured to operably generate a periodic waveform according to the second clock signal; a random waveform generator, which is configured to operably generate a random waveform according to the first clock signal; and a computation unit, which is configured to sample the random waveform and the periodic waveform, so as to compute to generate the spread spectrum control signal.

From yet another perspective, the present invention provides a clock generation method, which is configured to operably generate a spread spectrum clock signal having a spread spectrum according to a first clock signal and a second clock signal, wherein the spread spectrum clock signal has a fundamental frequency, and wherein under control of the spread spectrum control signal, the spread spectrum clock signal has a switching frequency variation; the clock generation method comprising: generating a spread spectrum clock signal having a spread spectrum according to a spread spectrum control signal; and generating the spread spectrum control signal according to the first clock signal and the second clock signal; wherein the step for generating the spread spectrum control signal includes: generating a periodic waveform according to the second clock signal; generating a random periodic waveform according to the first clock signal; and sampling the random waveform and the periodic waveform, so as to compute to generate the spread spectrum control signal.

In one embodiment, the periodic waveform is a triangular waveform, a sawtooth waveform or a sinusoidal waveform.

In one embodiment, the random waveform is a pseudo random step-type waveform.

In some embodiments, the periodic waveform generator includes: an up/down counter or a lookup table circuit, wherein the up/down counter generates the periodic waveform according to the second clock signal by counting, or wherein the lookup table circuit generates the periodic waveform according to the second clock signal by referring to a lookup table.

In one embodiment, the first clock signal is the spread spectrum clock signal, which is configured to generate the random waveform in a feedback configuration, wherein the first clock signal and the second clock signal are from different sources which are independent to each other; wherein the computation unit includes: a sampling synchronization circuit, which is configured to operably sample the periodic waveform based upon the first clock signal, so as to generate a sampled periodic waveform, so that the sampled periodic waveform is synchronous with a sampling frequency of the random waveform; and a computation subunit, which is configured to operably generate the spread spectrum control signal according to a sum of the sampled periodic waveform plus a signal related to the random waveform.

In some embodiments, (1) the computation subunit is configured to operably generate the spread spectrum control signal according to the sum of the sampled periodic waveform plus the random waveform; or (2) the computation unit further includes: a sampling control circuit, which is configured to operably sample the random waveform based on a divided frequency, so as to generate a divided-frequency random waveform, wherein the computation subunit is configured to operably generate the spread spectrum control signal according to the sum of the sampled periodic waveform plus the divided-frequency random waveform.

In one embodiment, the computation unit further includes: a frequency divider unit, wherein the computation subunit is configured to operably generate an initial spread spectrum control signal according to a sum of the sampled periodic waveform plus the signal related to the random waveform, wherein the frequency divider unit generates the spread spectrum control signal by dividing a frequency of the initial spread spectrum control signal by m, wherein m is a positive integer.

In one embodiment, the computation unit further includes: a control signal generator, which is configured to operably generate a switching control signal having a random characteristic, and wherein the computation subunit is configured to randomly execute summation or subtraction between the sampled periodic waveform and the signal related to the random waveform according to the switching control signal, to generate a computation result, and the computation subunit is configured to operably generate the spread spectrum control signal according to the computation result.

In one embodiment, the computation unit includes: a control signal generator, which is configured to operably generate a switching control signal, wherein the switching control signal has a random characteristic; and a computation subunit, which is configured to randomly execute summation or subtraction between the periodic waveform and a signal related to the random waveform according to the switching control signal, to generate a computation result, and wherein the computation subunit is configured to operably generate the spread spectrum control signal according to the computation result.

In one embodiment, the spread spectrum control further includes: a sampling control circuit, which is configured to operably sample the random waveform based on a divided frequency, so as to generate a divided-frequency random waveform, wherein the computation subunit is configured to randomly execute summation or subtraction between the periodic waveform and the divided-frequency random waveform according to the switching control signal, to generate the computation result, and wherein the computation subunit is configured to operably generate the spread spectrum control signal according to the computation result.

In one embodiment, the first clock signal configured to operably generate the random waveform is different and independent from a clock signal configured to operably generate the switching control signal.

Advantages of the present invention include: that the present invention can improve spread spectrum performance and expand the applicable range of the spread spectrum frequencies by adopting a mixture of two different spread spectrum techniques; and that by triggering a random waveform generator to update a time point for randomization via a sampling control circuit, the present invention can further improve the spread spectrum performance.

The objectives, technical details, features, and effects of the present invention will be better understood with regard to the detailed description of the embodiments below, with reference to the attached drawings.

BRIEF DESCRIPTION OF THE DRAWINGS

FIG. 17 shows a comparison table of simulation results of spread spectrum modulation methods processed by Fast Fourier Transform ((FFT).

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1A:
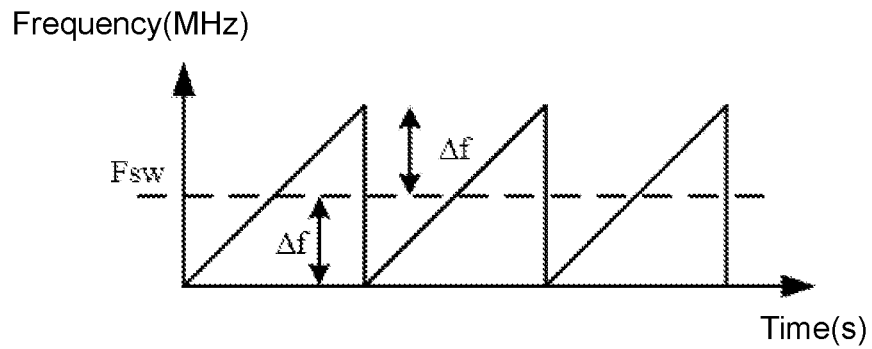
FIG. 1A and FIG. 1B show modulation waveform diagrams according to a conventional spread spectrum modulation method.
Figure 1B:
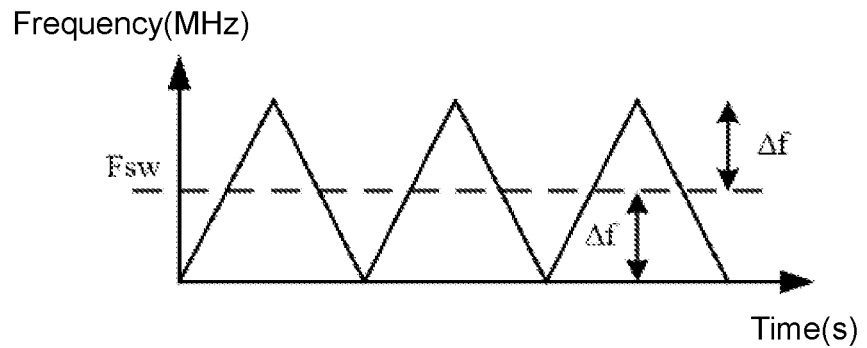
Figure 2:
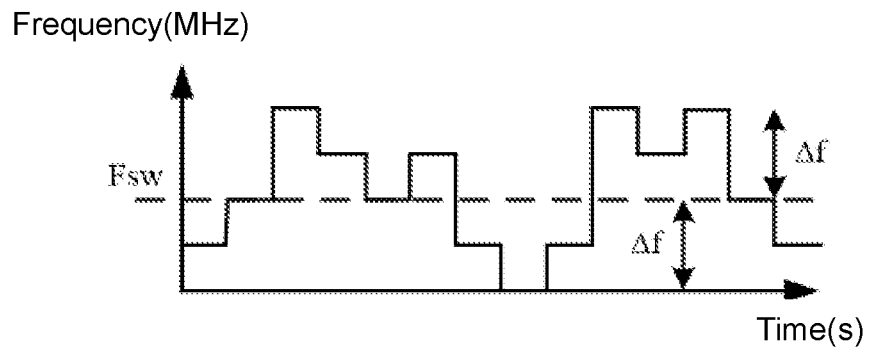
FIG. 2 shows a frequency hopping waveform diagram according to another conventional spread spectrum modulation method.
Figure 3:
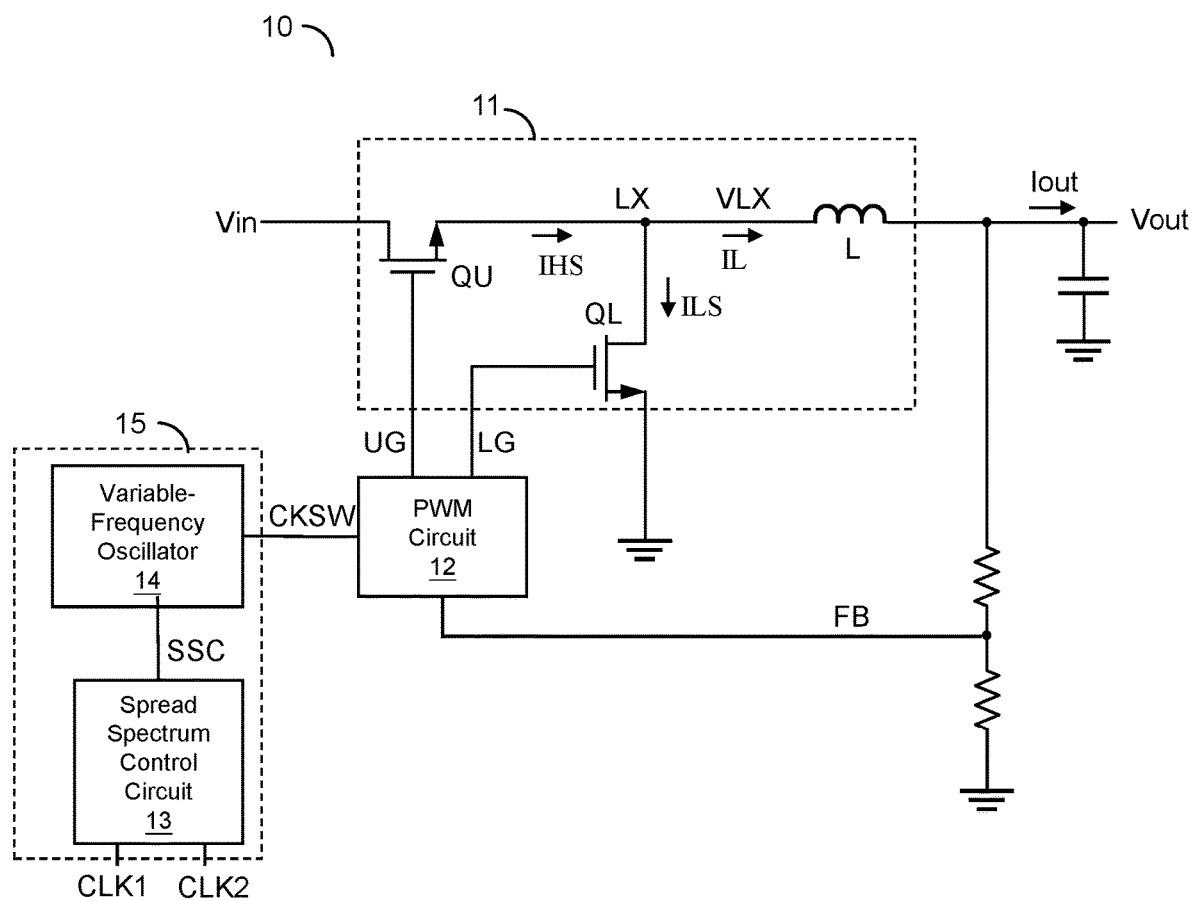
FIG. 3 shows a schematic circuit block diagram of a spread spectrum switching power converter circuit according to an embodiment of the present invention.

Please refer to FIG. 3, which shows a schematic circuit block diagram of a spread spectrum switching power converter circuit according to an embodiment of the present invention. As shown in FIG. 3, the spread spectrum switching power converter circuit 10 of the present invention includes: a power stage circuit 11, a pulse width modulation (PWM) circuit 12, a spread spectrum control circuit 13 and a variable frequency oscillator 14. The power stage circuit 11 includes: an inductor L and at least one power switch, in this embodiment the synchronous switching power switches QU and QL. The switching power switch QU and the switching power switch QL are switched according to a switching signal UG and a switching signal LG, respectively, so as to execute power conversion. The switching power switch QU is coupled between an input power Vin and a switching node LX, whereas, the switching power switch QU is coupled between the switching node LX and a ground level. The inductor L is coupled between the switching node LX and an output power Vout. By means of the above configuration, the power stage circuit 11 converts the input power Vin to the output power Vout. The power stage circuit 11 of this embodiment is implemented as a buck power stage circuit.

It should be understood that the implementation of the power stage circuit 11 shown in FIG. 3 as a buck power stage circuit in the above-mentioned preferred embodiment is only an illustrative example, but not for limiting the broadest scope of the present invention. In other embodiments, it is also practicable and within the scope of the present invention that the power stage circuit 11 can be a boost, inverting, buck-boost, inverting-boost or flyback power stage circuit, as shown in FIGS. 12A-12K.

The variable frequency oscillator 14 is configured to operably generate a spread spectrum clock signal CKSW having a spread spectrum according to a spread spectrum control signal SSC, wherein the spread spectrum clock signal CKSW has a fundamental frequency Ff, and wherein under control of the spread spectrum control signal SSC, the spread spectrum clock signal CKSW has a switching frequency variation $\Delta f$. In one embodiment, the variable frequency oscillator 14 can control a frequency of the spread spectrum clock signal CKSW according to a level of the spread spectrum control signal SSC. The level of the spread spectrum control signal SSC can be for example a voltage level or a current level. In other words, the variable frequency oscillator 14 can be for example a voltage-controlled oscillator or a current-controlled oscillator.

In one embodiment, the spread spectrum control circuit 13 is configured to operably generate the spread spectrum control signal SSC according to a first clock signal CLK1 and a second clock signal CLK2, the details of which will be described later. In one embodiment, the spread spectrum control circuit 13 and the variable frequency oscillator 14 can be integrated as a clock generator circuit 15, which is configured to operably generate the spread spectrum clock signal CKSW according to the first clock signal CLK1 and the second clock signal CLK2.

The PWM circuit 12 is configured to operably generate a switching signal UG and a switching signal LG according to a feedback signal FB and based on the spread spectrum clock signal CKSW. In one embodiment, the feedback signal FB is correlated with the output power Vout. As shown in FIG. 3, in one embodiment, the feedback signal FB can be for example a divided voltage of the output power Vout.

Under the control of the spread spectrum control signal SSC, the spread spectrum clock signal CKSW has a characteristic of spread spectrum; accordingly, the switching signal UG, the switching signal LG, and any voltage or current generated by the power stage circuit 11 which has a characteristic of switching (e.g., a voltage at the switching node LX, an inductor current IL, or switch currents HIS and ILS) all have a characteristic of spread spectrum. Thus, electromagnetic interference caused by the switching operation of the power stage circuit 11 can be effectively reduced.

Figure 4:
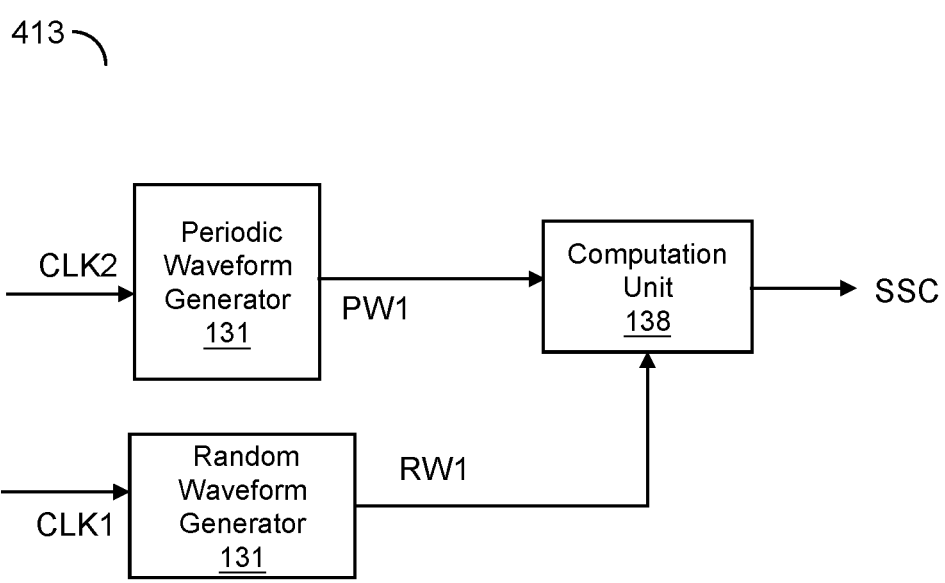
FIG. 4 shows a schematic circuit block diagram of a spread spectrum control circuit according to an embodiment of the present invention.
Figure 8:
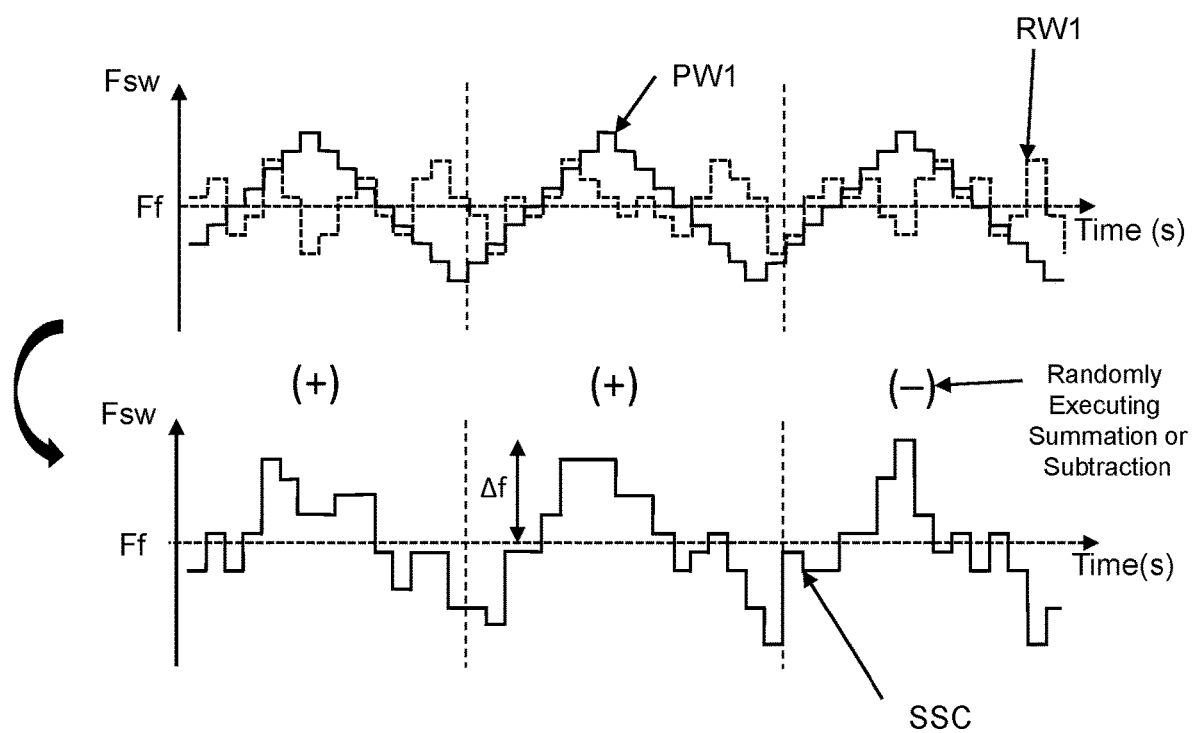
FIG. 8 shows an embodiment of the present invention, wherein a spread spectrum control signal is generated according to a periodic waveform (i.e., triangular waveform) and a random waveform (i.e., pseudo random waveform).
Figure 9:
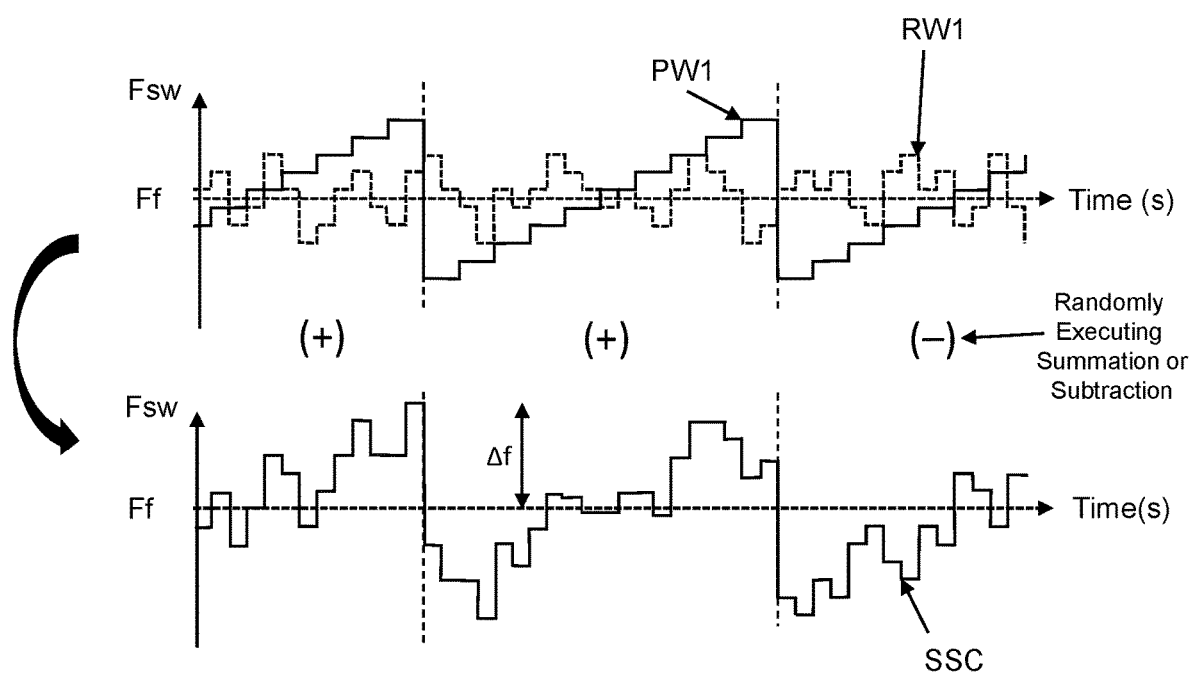
FIG. 9 shows an embodiment of the present invention, wherein a spread spectrum control signal is generated according to a periodic waveform (i.e., sawtooth waveform) and a random waveform (i.e., pseudo random waveform).
Figure 10:
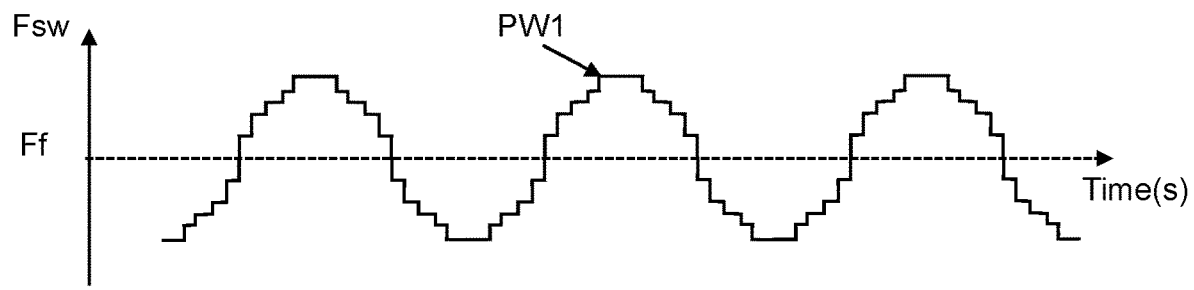
FIG. 10 shows another embodiment of the periodic waveform (i.e., sinusoidal waveform) according to the present invention.

Please refer to FIG. 4, which shows a schematic circuit block diagram of a spread spectrum control circuit (i.e. spread spectrum control circuit 413) according to an embodiment of the present invention. As shown in FIG. 4, in one embodiment, the spread spectrum control circuit 413 includes: a periodic waveform generator 131, a random waveform generator 132 and a computation unit 138. The random waveform generator 132 is configured to operably generate a random waveform RW1 according to a first clock signal CLK1. The periodic waveform generator 131 is configured to operably generate a periodic waveform PW1 according to a second clock signal CLK2. The computation unit 138 is configured to sample the random waveform RW1 and the periodic waveform PW1, so as to compute to generate the spread spectrum control signal SSC. In one embodiment, the periodic waveform PW1 can be for example a triangular waveform (as shown in FIG. 8), a sawtooth waveform (as shown in FIG. 9) or a sinusoidal waveform (as shown in FIG. 10). In one embodiment, the random waveform RW1 can be for example a pseudo random step-type waveform.

Figure 5:
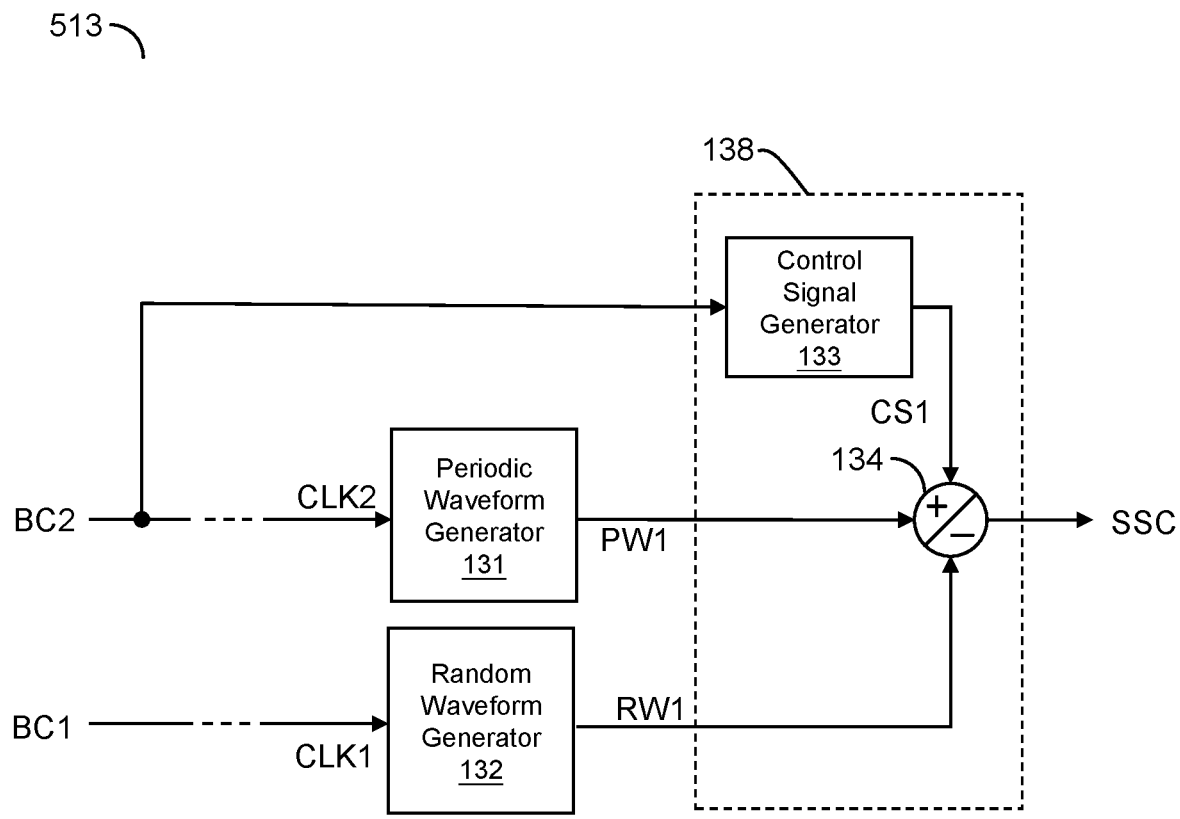
FIG. 5 shows a schematic circuit block diagram of a spread spectrum control circuit according to another embodiment of the present invention.

Please refer to FIG. 5, which shows a schematic circuit block diagram of a spread spectrum control circuit according to a specific embodiment of the present invention. As shown in FIG. 5, in this embodiment, the computation unit 138 of a spread spectrum control circuit 513 includes: a control signal generator 133 and a summation/subtraction unit 134.

In one embodiment, the first clock signal CLK1 is different from the second clock signal CLK2, wherein the first clock signal CLK1 and the second clock signal CLK2 are coupled to a fundamental clock signal BC1 and a fundamental clock signal BC2, respectively. In one embodiment, the first clock signal CLK1 can be obtained through directly connecting to the fundamental clock signal BC1, whereas, the second clock signal CLK2 can be obtained through directly connecting to the fundamental clock signal BC2. In another embodiment, the first clock signal CLK1 and the second clock signal CLK2 can be obtained through frequency-dividing the fundamental clock signal BC1 and the fundamental clock signal BC2, respectively. In one embodiment, the first clock signal CLK1 is the fundamental clock signal BC1, whereas, the second clock signal CLK2 is a frequency-divided signal of the fundamental clock signal BC2. It is worthwhile noting that, the fundamental clock signal BC1 configured to operably generate the random waveform RW1 is different and independent from the fundamental clock signal (e.g., BC2) configured to operably generate a switching control signal CS1.

In one embodiment, the control signal generator 133 is configured to operably generate a switching control signal CS1. In one embodiment, the control signal generator 133 is configured to operably generate a switching control signal CS1 (according to for example the fundamental clock signal BC2). The summation/subtraction unit 134 is configured to randomly execute summation or subtraction between the periodic waveform PW1 and the random waveform RW1 according to the switching control signal CS1, so as to generate the spread spectrum control signal SSC.

Figure 6:
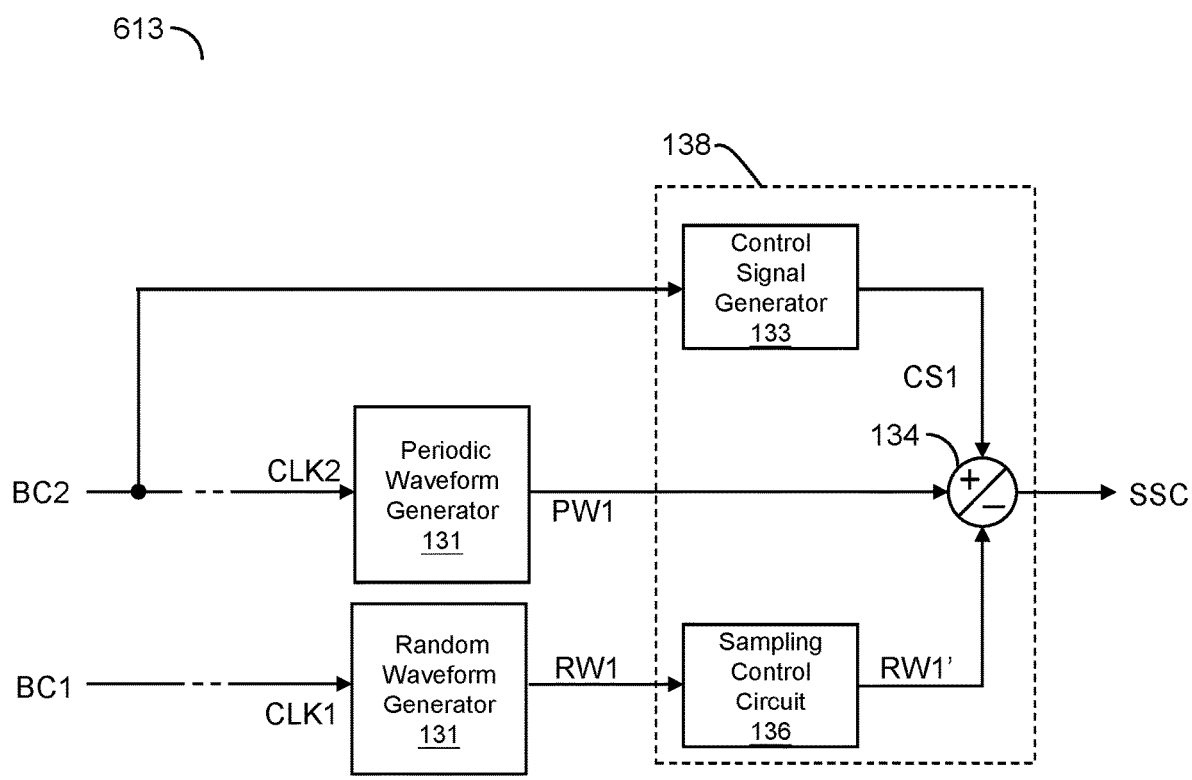
FIG. 6 shows a schematic circuit block diagram of a spread spectrum control circuit according to yet another embodiment of the present invention.

Please refer to FIG. 6, which shows a schematic circuit block diagram of a spread spectrum control circuit according to yet another embodiment of the present invention. The spread spectrum control circuit 613 of this embodiment shown in FIG. 6 is similar to the spread spectrum control circuit 513 of the embodiment shown in FIG. 5, but as shown in FIG. 6, the spread spectrum control circuit 613 further includes a sampling control circuit 136, which is configured to operably sample the random waveform RW1 based on a divided frequency. For example, the sampling control circuit 136 can sample the random waveform RW1 at every nth period of the second clock signal CLK2, so as to generate a divided-frequency random waveform RW1', wherein n is a positive integer. In this embodiment, a summation/subtraction unit 134 is configured to randomly execute summation or subtraction between the periodic waveform. PW1 and the divided-frequency random waveform RW1' according to the switching control signal CS1, so as to generate the spread spectrum control signal SSC. In one embodiment, the sampling period n can be, for example but not limited to, 1, 2, 4 or 8. In one embodiment, preferably, the sampling period n can be 8. Different sampling periods n can result in different spread spectrum performances. In this embodiment, the control signal generator 133, the summation/subtraction unit 134 and the sampling control circuit 136 together for example correspond to the computation unit 138 in the previous embodiment.

Figure 7A:
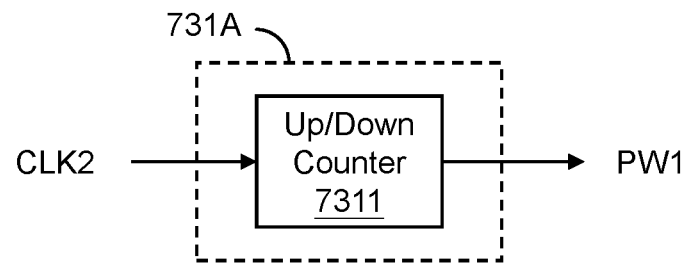
FIG. 7A and FIG. 7B show schematic circuit block diagrams of a periodic waveform generator according to two specific embodiments of the present invention, respectively.

Please refer to FIG. 7A, which shows a schematic circuit block diagram of a periodic waveform generator (i.e., periodic waveform generator 731A) according to a specific embodiment of the present invention. In this embodiment, the periodic waveform generator 731A includes: an up/down counter 7311, which is configured to operably generate the periodic waveform PW1 according to the second clock signal CLK2 by up/down counting.

Figure 7B:
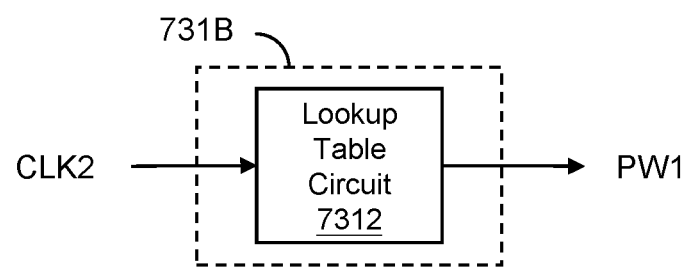

Please refer to FIG. 7B, which shows a schematic circuit block diagram of a periodic waveform generator (i.e., periodic waveform generator 731B) according to another specific embodiment of the present invention. In this embodiment, the periodic waveform generator 731B includes: a lookup table circuit 7312, which stores predetermined periodic waveforms, and by referring to the lookup table, the lookup table circuit 7312 reads out a predetermined periodic waveform corresponding to the second clock signal CLK2, so as to generate the above-mentioned periodic waveform PW1.

Please refer to FIG. 8, which shows an embodiment of the present invention, wherein the spread spectrum control signal is generated according to a periodic waveform (i.e., triangular waveform in this embodiment) and a random waveform (i.e., pseudo random waveform in this embodiment).

As shown in FIG. 8, in one embodiment, the periodic waveform PW1 generated by the periodic waveform generator can be a triangular waveform, whereas, the random waveform RW1 generated by the random waveform generator can be a pseudo random waveform. The spread spectrum control signal SSC shown in FIG. 8 is generated by randomly executing summation or subtraction between the periodic waveform PW1 and the random waveform RW1 according to the switching control signal CS1 via the summation/subtraction unit 134.

It is worthwhile mentioning that, according to FIG. 8, the spread spectrum control signal SSC generated by this embodiment has characteristics of both triangular waveform and pseudo random waveform. Moreover, because the summation or subtraction between the periodic waveform PW1 and the random waveform RW1 is also randomly determined by the switching control signal CS1, the spread spectrum performance is even better.

It is worthwhile noting that, the level of the periodic waveform PW1, the level of the random waveform RW1 and the level of the spread spectrum control signal SSC can be a voltage level, a current level or a digital value, which indicates the corresponding switching frequency. In one embodiment, the middle value of the periodic waveform PW1, the middle value of the random waveform RW1, and the middle value of the spread spectrum control signal SSC correspond to the fundamental frequency Ff, with a switching frequency variation which is equal to $\Delta f$.

Please refer to FIG. 9, which shows an embodiment of the present invention, wherein the spread spectrum control signal is generated according to a periodic waveform (i.e., sawtooth waveform in this embodiment) and a random waveform (i.e., pseudo random waveform in this embodiment).

In the embodiment as shown in FIG. 9, the periodic waveform PW1 generated by the periodic waveform generator can be a sawtooth waveform, whereas, the random waveform RW1 generated by the random waveform generator can be a pseudo random waveform. The spread spectrum control signal SSC shown in FIG. 9 is generated by randomly executing summation or subtraction between the periodic waveform PW1 and the random waveform RW1 according to the switching control signal CS1 via the summation/subtraction unit 134. It is worthwhile mentioning that, according to FIG. 9, the spread spectrum control signal SSC generated by this embodiment has characteristics of both sawtooth waveform and pseudo random waveform.

Please refer to FIG. 10, which shows a periodic waveform (i.e., sinusoidal waveform) according to yet another embodiment of the present invention. In one embodiment, as shown in FIG. 10, the periodic waveform PW1 generated by the periodic waveform generator can be a sinusoidal waveform. By the same mechanism as described in the above embodiments, the spread spectrum control signal SSC shown in FIG. 10 can be generated by randomly executing summation or subtraction between the sinusoidal waveform (i.e., the periodic waveform PW1) and the pseudo random waveform (i.e., the random waveform RW1).

Figure 11A:
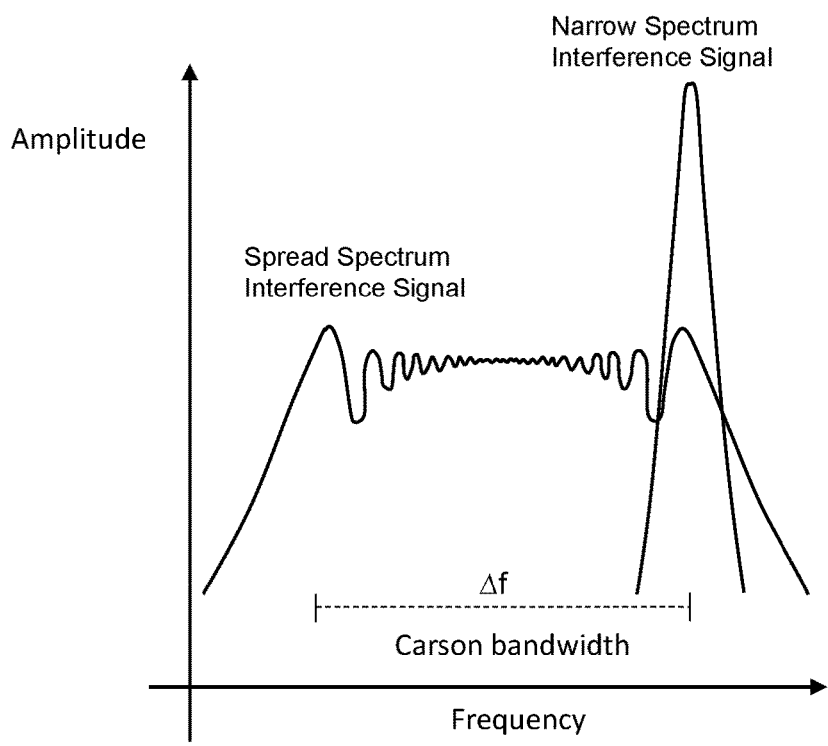
FIG. 11A shows a comparison between a power frequency spectrum of a non-modulated narrow spectrum interference signal and a frequency spectrum processed by downward spread spectrum according to an embodiment of the present invention.
Figure 11B:
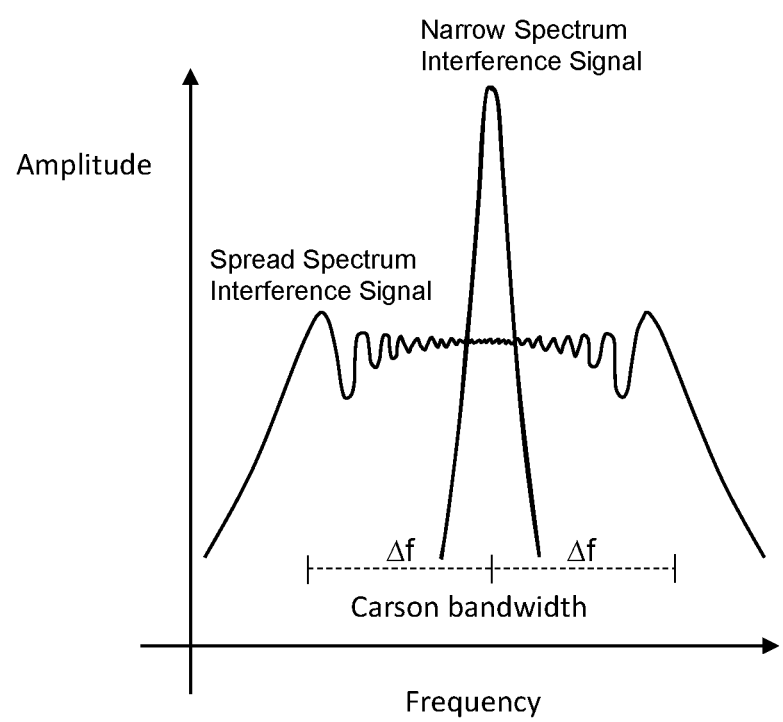
FIG. 11B shows a comparison between a power frequency spectrum of a non-modulated narrow spectrum interference signal and a frequency spectrum processed by outward spread spectrum according to an embodiment of the present invention.
Figure 12A:
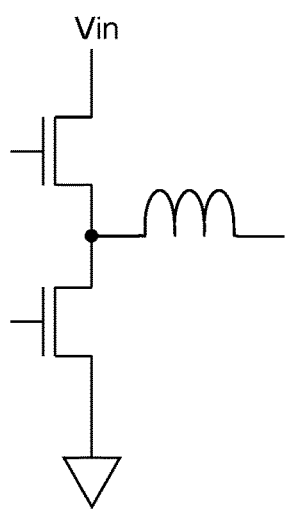
FIGS. 12A-12K show synchronous and asynchronous buck, boost, inverting, buck-boost, inverting-boost and flyback power stage circuits, respectively.
Figure 12B:
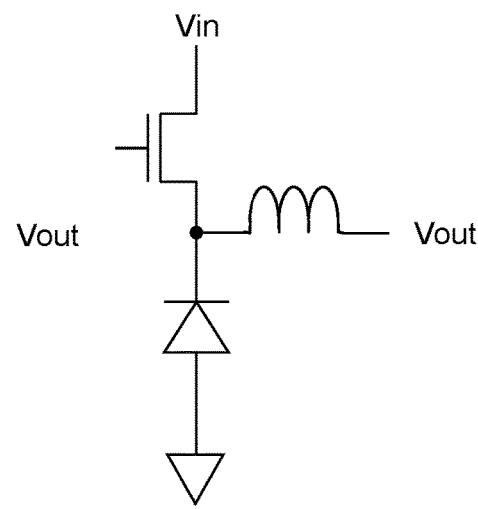
Figure 12C:
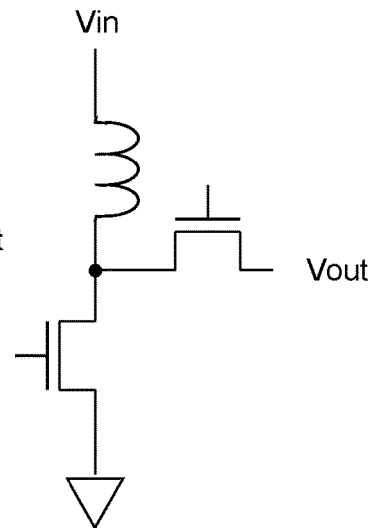
Figure 12D:
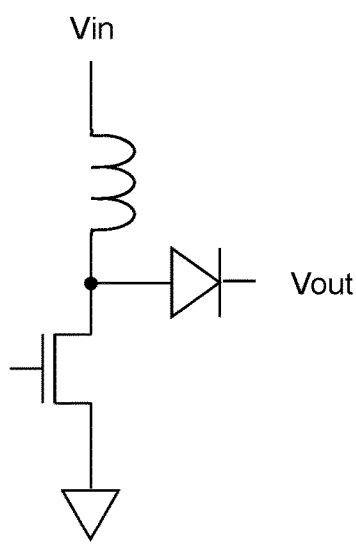
Figure 12E:
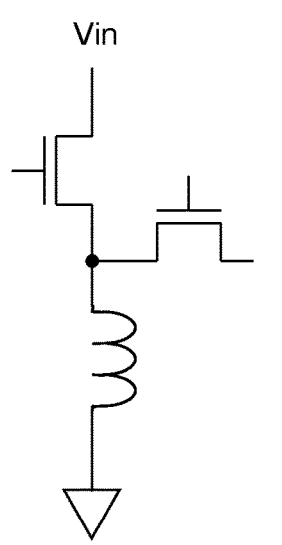
Figure 12F:
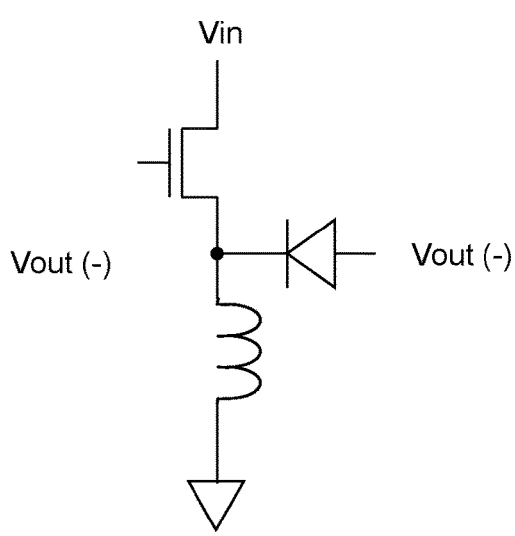
Figure 12G:
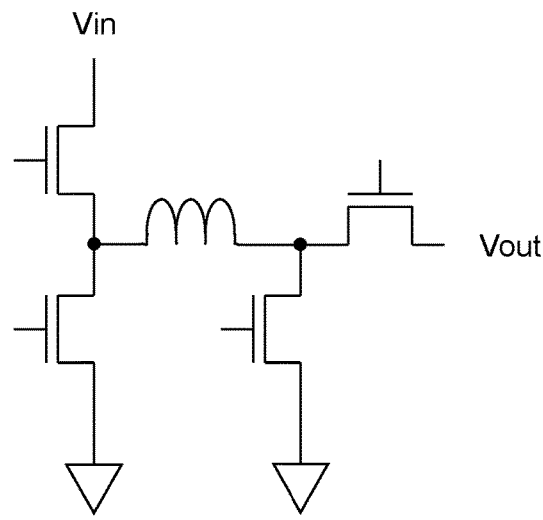
Figure 12H:
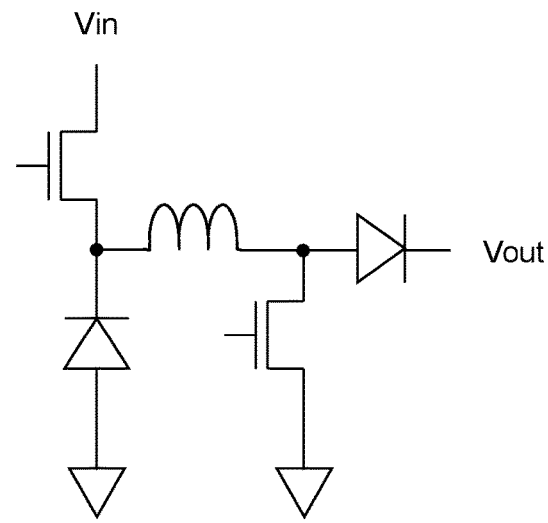
Figure 12I:
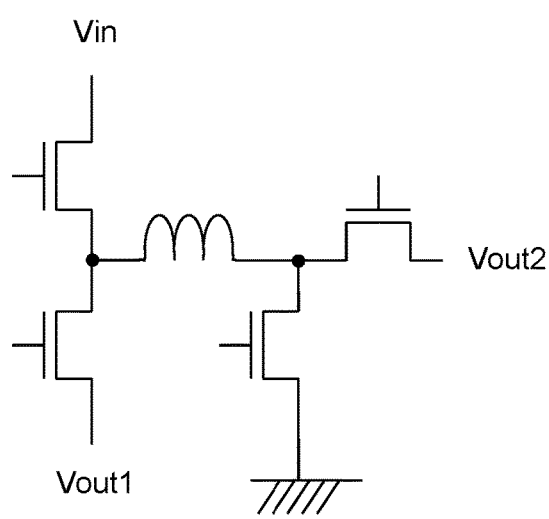
Figure 12J:
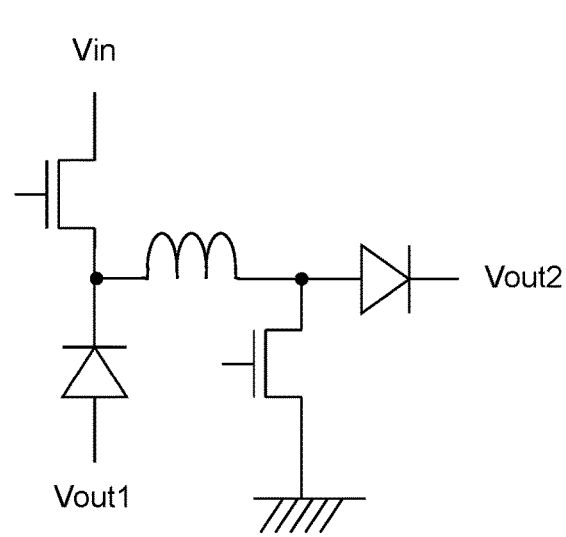
Figure 12K:
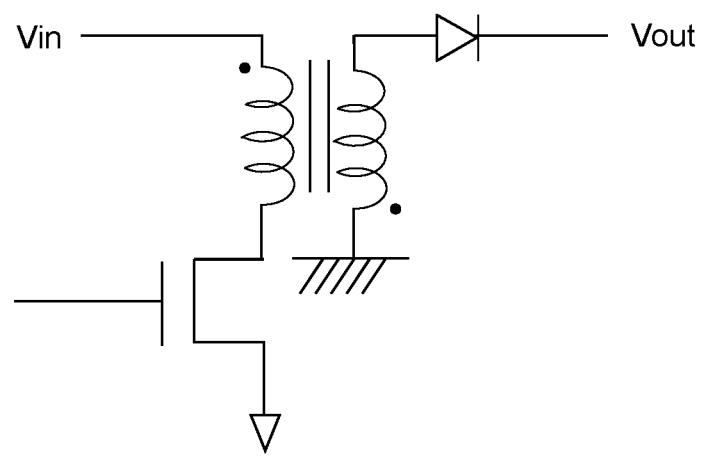

Please refer to FIG. 11A and FIG. 11B. FIG. 11A shows a comparison between a power frequency spectrum of a non-modulated narrow spectrum interference signal and a frequency spectrum processed by downward spread spectrum according to an embodiment of the present invention, whereas, FIG. 11B shows a comparison between a power frequency spectrum of a non-modulated narrow spectrum interference signal and a frequency spectrum processed by outward spread spectrum according to another embodiment of the present invention. According to CISPR 25 specification, an electromagnetic interference is measured by a bandwidth resolution of 9 kHz for a frequency band ranging from 150 kHz to 30 MHz, whereas, an electromagnetic interference is measured by a bandwidth resolution of 120 kHz for a frequency band ranging from 30 MHz to 1 GHz. As is well known by those skilled in the art, a periodic analog spread spectrum processing has a better effect to reduce peak energy of the frequency band ranging from 150 kHz to 30 MHz. Besides, based upon Carson's bandwidth regulation, the periodic analog spread spectrum can modify the switching frequency variation Δf to improve the suppression performance. On the other hand, because a frequency hopping spread spectrum processing can randomly alter frequency, its effect is not affected by the bandwidth resolution of 120 kHz. Consequently, the frequency hopping spread spectrum has a better effect to reduce peak energy of harmonics of the switching frequency during the frequency band ranging from 30 MHz to 1 GHz.

The spread spectrum switching power converter circuit of the present invention can randomly execute summation or subtraction between two different spread spectrum techniques. Besides maintaining respective characteristics of the two different spread spectrum techniques, the spread spectrum switching power converter circuit of the present invention can also reduce the electromagnetic interference in a frequency band ranging from 150 kHz to 1 GHz. Moreover, the spread spectrum switching power converter circuit of the present invention can sample the random waveform RW1 at different sampling periods n, to thereby provide different electromagnetic interference reduction effect.

Figure 13:
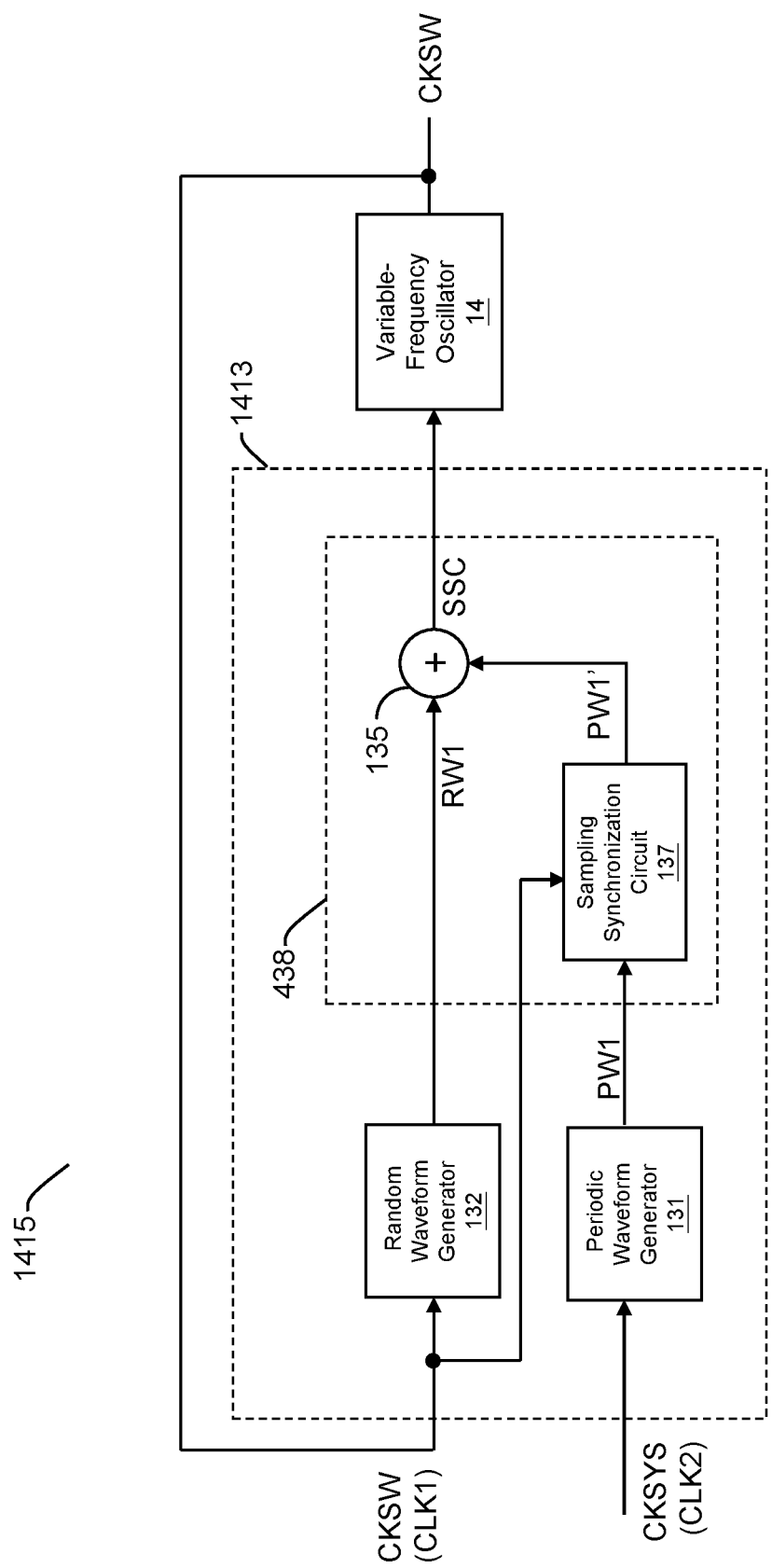
FIG. 13 shows a circuit block diagram of a clock generator circuit according to a specific embodiment of the present invention and a circuit block diagram of a spread spectrum control circuit according to a specific embodiment of the present invention.

Please refer to FIG. 13, which shows a circuit block diagram of a clock generator circuit (i.e., clock generator circuit 1415) according to a specific embodiment of the present invention and a circuit block diagram of a spread spectrum control circuit (i.e., spread spectrum control circuit 1413) according to a specific embodiment of the present invention. In one embodiment, as shown in FIG. 13, the spread spectrum control circuit 1413 includes: a periodic waveform generator 131, a random waveform generator 132 and a computation unit 438. In one embodiment, the computation unit 438 includes: a sampling synchronization circuit 137 and a summation unit 135.

In this embodiment, the random waveform generator 132 is configured to operably generate the random waveform RW1 according to the first clock signal CLK1. In this embodiment, the first clock signal CLK1 is coupled to a spread spectrum clock signal CKSW; in other words, the first clock signal CLK1 is the spread spectrum clock signal CKSW. The periodic waveform generator 131 is configured to operably generate the periodic waveform PW1 according to the second clock signal CLK2 (which is coupled to for example the system clock signal CKSYS). The computation unit 438 is configured to compute the random waveform RW1 and the periodic waveform PW1, so as to generate the spread spectrum control signal SSC. The details of the periodic waveform generator 131 have been described with reference to FIG. 7A and FIG. 7B.

In one embodiment, the periodic waveform PW1 can be for example a triangular waveform (as shown in FIG. 8), a sawtooth waveform (as shown in FIG. 9) or a sinusoidal waveform (as shown in FIG. 10). In one embodiment, the random waveform RW1 can be for example a random step-type waveform. In one embodiment, the random waveform RW1 can be for example a pseudo random step-type waveform.

It is worthwhile mentioning that, in one embodiment, the first clock signal CLK1 and the second clock signal CLK2 are clock signals provided from different sources and which are independent from each other. To be more specific, because the first clock signal CLK1 is coupled to the spread spectrum clock signal CKSW, the first clock signal CLK1 has a characteristic of spread spectrum. On the other hand, the second clock signal CLK2 (i.e., the system clock signal CKSYS) can be a clock signal having no characteristic of spread spectrum.

In this embodiment, the sampling synchronization circuit 137 is configured to operably sample the periodic waveform PW1 based upon the first clock signal CLK1 (i.e., the spread spectrum clock signal CKSW), so as to generate a sampled periodic waveform PW1', so that the sampled periodic waveform PW1' is synchronous with a sampling frequency of the random waveform RW1. Subsequently, the summation unit 135 executes summation between the sampled periodic waveform PW1' and the random waveform RW1, so as to generate the spread spectrum control signal SSC. The variable frequency oscillator 14 is configured to operably generate the spread spectrum clock signal CKSW according to the spread spectrum control signal SSC.

From one perspective, in this embodiment, the spread spectrum clock signal CKSW is fed back to the spread spectrum control circuit 1413 which controls the characteristic of spread spectrum, so as to generate the spread spectrum control signal SSC, thereby controlling the variable frequency oscillator 14 in a feedback configuration, to generate the spread spectrum clock signal CKSW, whereby the spread spectrum performance is even more improved.

Figure 14:
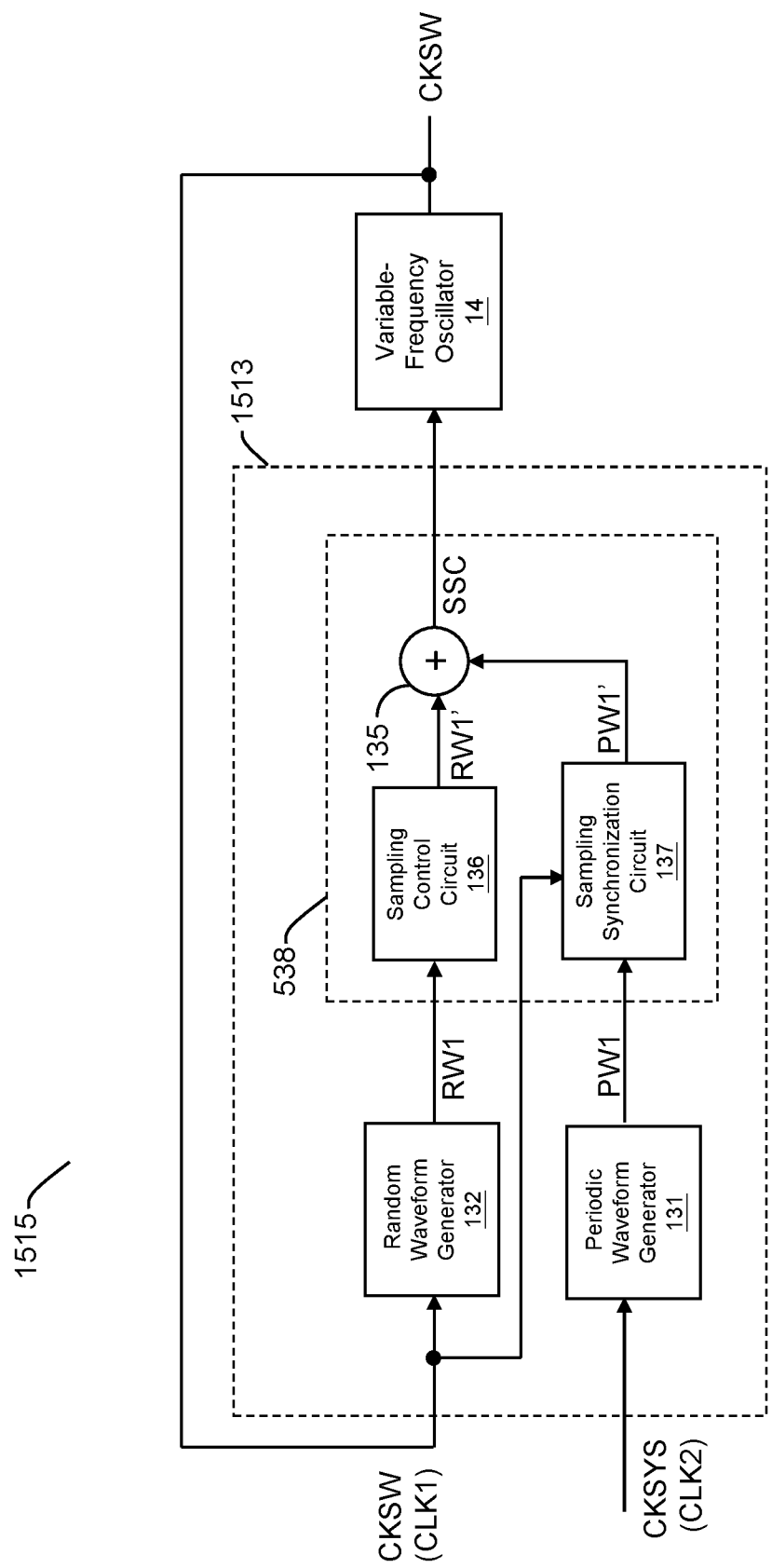
FIG. 14 shows a circuit block diagram of a clock generator circuit according to another specific embodiment of the present invention and a circuit block diagram of a spread spectrum control circuit according to another specific embodiment of the present invention.

Please refer to FIG. 14, which shows a circuit block diagram of a clock generator circuit (i.e., clock generator circuit 1515) according to another specific embodiment of the present invention and a circuit block diagram of a spread spectrum control circuit (i.e., spread spectrum control circuit 1513) according to another specific embodiment of the present invention. This embodiment of FIG. 14 is similar to the embodiment of FIG. 13, but is different in that the computation unit 538 of the spread spectrum control circuit

1513 further includes a sampling control circuit 136, which is configured to operably sample the random waveform based on a divided frequency RW1, so as to generate a divided-frequency random waveform RW1'. The operation details of the sampling control circuit 136 have been described with reference to FIG. 6. In this embodiment, the summation unit 135 executes summation between the sampled periodic waveform PW1' and the divided-frequency random waveform RW1', so as to generate the spread spectrum control signal SSC.

Figure 15:
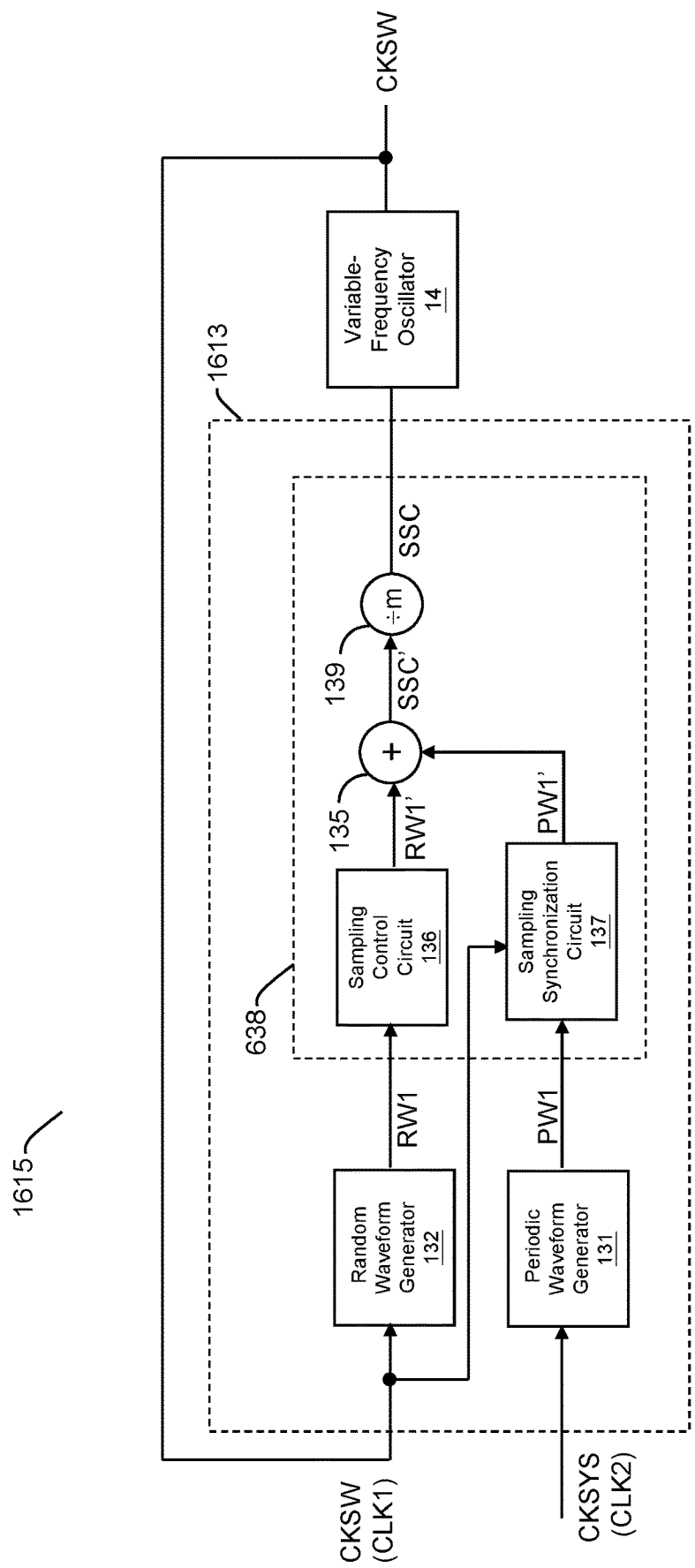
FIG. 15 shows a circuit block diagram of a clock generator circuit according to yet another specific embodiment of the present invention and a circuit block diagram of a spread spectrum control circuit according to yet another specific embodiment of the present invention.

Please refer to FIG. 15, which shows a circuit block diagram of a clock generator circuit (i.e., clock generator circuit 1615) according to yet another specific embodiment of the present invention and a circuit block diagram of a spread spectrum control circuit (i.e., spread spectrum control circuit 1613) according to yet another specific embodiment of the present invention. This embodiment of FIG. 15 is similar to the embodiment of FIG. 14, but is different in that a computation unit 638 of the spread spectrum control circuit 1613 further includes a frequency divider unit 139, which is configured to operably divide a frequency of a spread spectrum control signal SSC' by m-fold to generate the spread spectrum control signal SSC, thereby controlling the variable frequency oscillator 14 to generate the spread spectrum clock signal CKSW, wherein the spread spectrum control signal SSC' is generated by summing the sampled periodic waveform PW1' and the divided-frequency random waveform RW1', and wherein m is a positive integer. In one embodiment, the sampling control circuit 136 in FIG. 15 can be omitted. Under such situation, the computation unit 638 can directly execute summation between the sampled periodic waveform PW1' and the random waveform RW1, to generate the spread spectrum control signal SSC'.

Figure 16:
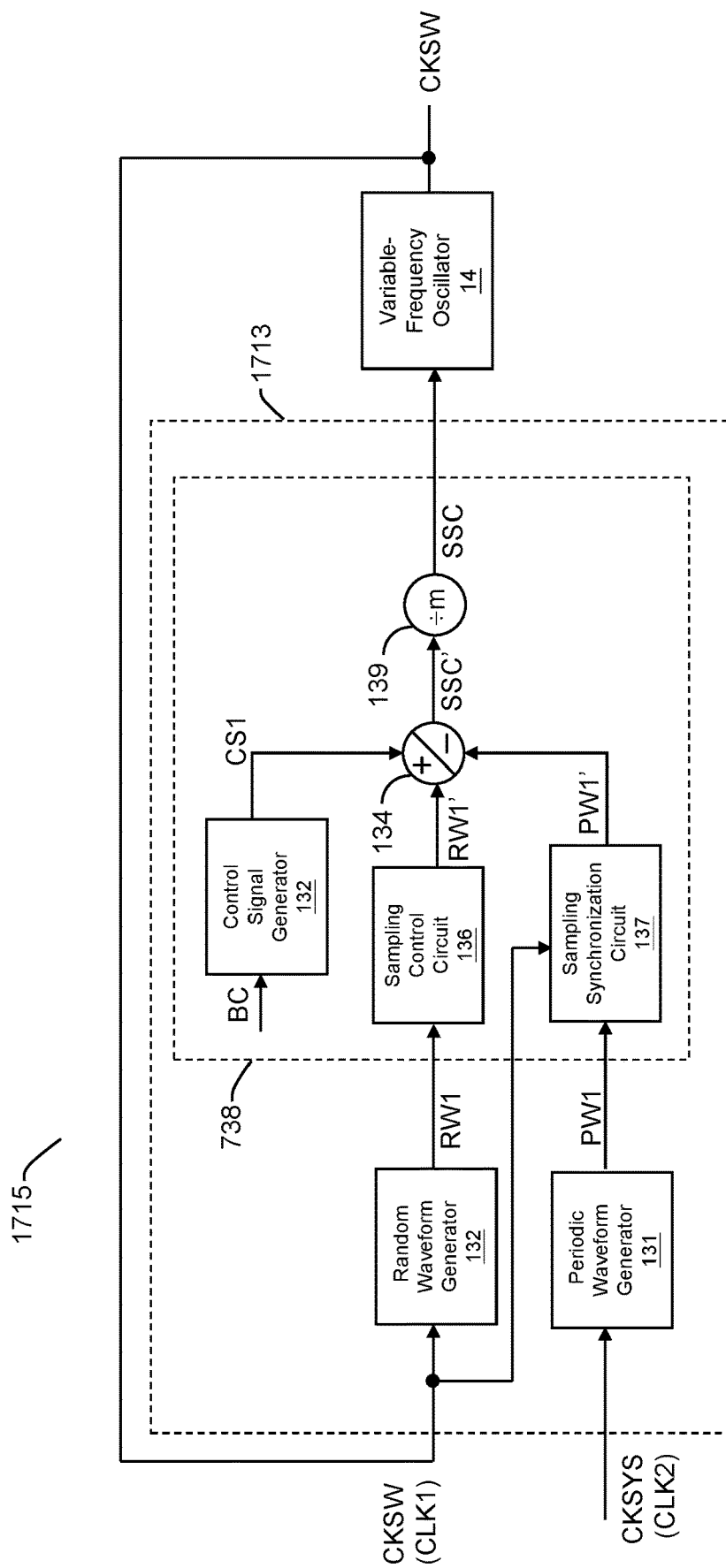
FIG. 16 shows a circuit block diagram of a clock generator circuit according to still another specific embodiment of the present invention and a circuit block diagram of a spread spectrum control circuit according to still another specific embodiment of the present invention.

Please refer to FIG. 16, which shows a circuit block diagram of a clock generator circuit (i.e., clock generator circuit 1715) according to still another specific embodiment of the present invention and a circuit block diagram of a spread spectrum control circuit (i.e., spread spectrum control circuit 1713) according to still another specific embodiment of the present invention. This embodiment of FIG. 16 is similar to the embodiment of FIG. 15, but is different in that a computation unit 738 of the spread spectrum control circuit 1713 further includes a control signal generator 133. Besides, this embodiment of FIG. 16 replaces the summation unit 135 with the summation/subtraction unit 134. The control signal generator 133 is configured to operably generate a random switching control signal CS1. The details of the generation of the random switching control signal CS1 have been described with reference to FIG. 5. In this embodiment, the summation/subtraction unit 134 is configured to operably execute summation or subtraction between the sampled periodic waveform PW1' and the divided-frequency random waveform RW1' according to the switching control signal CS1, so as to generate the spread spectrum control signal SSC'. In this embodiment, the control signal generator 133 is configured to operably generate the random switching control signal CS1 according to a fundamental clock signal BC. It is worthwhile noting that, the first clock signal CLK1 configured to operably generate the random waveform RW1 is different and independent from the fundamental clock signal (e.g., BC) configured to operably generate the switching control signal CS1.

Besides, in one embodiment, the sampling control circuit 136 in FIG. 16 can be omitted. Under such situation, the computation unit 738 can directly execute summation between the sampled periodic waveform PW1' and the random waveform RW1, so as to generate the spread spectrum control signal SSC'. In one embodiment, the frequency divider unit 139 in FIG. 16 can be omitted. Under such situation, the computation unit 738 can directly use the computation result of the summation/subtraction unit 134 as the spread spectrum control signal SSC.

Please refer to FIG. 17, which shows a comparison table of simulation results of spread spectrum modulation methods processed by Fast Fourier Transform ((FFT), corresponding to different combinations of waveforms by circuits of FIG. 5 and FIG. 6. In FIG. 17, the input power Vin is of 7V, the output current Iout is of 2A, the switching frequency Fsw is of 2.1 MHz, the output power Vout is of 5.2V, and the switching frequency variation is of $\Delta f \pm 6\%$. According to FIG. 17, the spread spectrum switching power converter circuit of the present invention adopts a mixture of two different spread spectrum techniques. To be more specific, the spread spectrum switching power converter circuit of the present invention adopts, for example but not limited to, a mixture of a triangular waveform and a pseudo random waveform, a mixture of a sawtooth waveform and a pseudo random waveform, a mixture of a triangular waveform and a pseudo random waveform having a sampling period equal to 8, and a mixture of a sawtooth waveform and a pseudo random waveform having a sampling period equal to 8. All such mixtures of two different spread spectrum techniques provides a better spread spectrum performance than the prior art using only one spread spectrum technique, and furthermore, the present invention also can expand the applicable frequency range of the spread spectrum processing.

As described above, advantages of the spread spectrum switching power converter circuit and the spread spectrum control method of the present invention include: that the present invention can improve spread spectrum performance and expand the applicable range of the spread spectrum frequencies by adopting a mixture of two different spread spectrum techniques; and that by triggering a random waveform generator to update a time point for randomization via a sampling control circuit, the present invention can further improve the spread spectrum performance.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A spread spectrum switching power converter circuit, comprising:
   a variable frequency oscillator, which is configured to operably generate a spread spectrum clock signal having a spread spectrum according to a spread spectrum control signal, wherein the spread spectrum clock signal has a fundamental frequency, and wherein under control of the spread spectrum control signal, the spread spectrum clock signal has a switching frequency variation;
   a spread spectrum control circuit, which is configured to operably generate the spread spectrum control signal according to a first clock signal and a second clock signal; and
   a pulse width modulation (PWM) circuit, which is configured to operably generate a switching signal having the spread spectrum according to a feedback signal and based on the spread spectrum clock signal;
   wherein the switching signal is configured to operably control a power stage circuit, wherein the power stage circuit includes: an inductor and at least one power switch which are coupled to each other, wherein the power stage circuit is configured to operably switch the power switch according to the switching signal having the spread spectrum, so as to execute power conversion;
   wherein the spread spectrum control circuit includes:
      a periodic waveform generator, which is configured to operably generate a periodic waveform according to the second clock signal;
      a random waveform generator, which is configured to operably generate a random waveform according to the first clock signal; and
      a computation unit, which is configured to sample the random waveform and the periodic waveform, so as to compute to generate the spread spectrum control signal.

2. The spread spectrum switching power converter circuit of claim 1, wherein the periodic waveform is a triangular waveform, a sawtooth waveform or a sinusoidal waveform.

3. The spread spectrum switching power converter circuit of claim 1, wherein the random waveform is a pseudo random step-type waveform.

4. The spread spectrum switching power converter circuit of claim 1, wherein the periodic waveform generator includes: an up/down counter or a lookup table circuit, wherein the up/down counter generates the periodic waveform according to the second clock signal by counting, or wherein the lookup table circuit generates the periodic waveform according to the second clock signal by referring to a lookup table.

5. The spread spectrum switching power converter circuit of claim 1, wherein the first clock signal is the spread spectrum clock signal, which is configured to generate the random waveform in a feedback configuration, wherein the first clock signal and the second clock signal are from different sources which are independent to each other;
   wherein the computation unit includes:
      a sampling synchronization circuit, which is configured to operably sample the periodic waveform based upon the first clock signal, so as to generate a sampled periodic waveform, so that the sampled periodic waveform is synchronous with a sampling frequency of the random waveform; and
      a computation subunit, which is configured to operably generate the spread spectrum control signal according to a sum of the sampled periodic waveform plus a signal related to the random waveform.

6. The spread spectrum switching power converter circuit of claim 5, wherein:
   (1) the computation subunit is configured to operably generate the spread spectrum control signal according to the sum of the sampled periodic waveform plus the random waveform; or
   (2) the computation unit further includes:
      a sampling control circuit, which is configured to operably sample the random waveform based on a divided frequency, so as to generate a divided-frequency random waveform, wherein the computation subunit is configured to operably generate the spread spectrum control signal according to the sum of the sampled periodic waveform plus the divided-frequency random waveform.

7. The spread spectrum switching power converter circuit of claim 5, wherein the computation unit further includes: a frequency divider unit, wherein the computation subunit is configured to operably generate an initial spread spectrum control signal according to a sum of the sampled periodic waveform plus the signal related to the random waveform, wherein the frequency divider unit generates the spread spectrum control signal by dividing a frequency of the initial spread spectrum control signal by m, wherein m is a positive integer.

8. The spread spectrum switching power converter circuit of claim 5, wherein the computation unit further includes: a control signal generator, which is configured to operably generate a switching control signal having a random characteristic, and wherein the computation subunit is configured to randomly execute summation or subtraction between the sampled periodic waveform and the signal related to the random waveform according to the switching control signal, to generate a computation result, and the computation subunit is configured to operably generate the spread spectrum control signal according to the computation result.

9. The spread spectrum switching power converter circuit of claim 1, wherein the computation unit includes:
   a control signal generator, which is configured to operably generate a switching control signal, wherein the switching control signal has a random characteristic; and
   a computation subunit, which is configured to randomly execute summation or subtraction between the periodic waveform and a signal related to the random waveform according to the switching control signal, to generate a computation result, and wherein the computation subunit is configured to operably generate the spread spectrum control signal according to the computation result.

10. The spread spectrum switching power converter circuit of claim 9, wherein the spread spectrum control further includes: a sampling control circuit, which is configured to operably sample the random waveform based on a divided frequency, so as to generate a divided-frequency random waveform, wherein the computation subunit is configured to randomly execute summation or subtraction between the periodic waveform and the divided-frequency random waveform according to the switching control signal, to generate the computation result, and wherein the computation subunit is configured to operably generate the spread spectrum control signal according to the computation result.

11. The spread spectrum switching power converter circuit of claim 9, wherein the first clock signal configured to operably generate the random waveform different and independent from a clock signal configured to operably generate the switching control signal.

12. A clock generator circuit, which is configured to operably generate a spread spectrum clock signal having a spread spectrum according to a first clock signal and a second clock signal, wherein the spread spectrum clock signal has a fundamental frequency, and wherein under control of the spread spectrum control signal, the spread spectrum clock signal has a switching frequency variation; the clock generator circuit comprising:
- a variable frequency oscillator, which is configured to operably generate a spread spectrum clock signal having a spread spectrum according to a spread spectrum control signal; and
- a spread spectrum control circuit, which is configured to operably generate the spread spectrum control signal according to the first clock signal and the second clock signal;
- wherein the spread spectrum control circuit includes:
  - a periodic waveform generator, which is configured to operably generate a periodic waveform according to the second clock signal;
  - a random waveform generator, which is configured to operably generate a random waveform according to the first clock signal; and
  - a computation unit, which is configured to sample the random waveform and the periodic waveform, so as to compute to generate the spread spectrum control signal.

13. The clock generator circuit of claim 12, wherein the periodic waveform is a triangular waveform, a sawtooth waveform or a sinusoidal waveform.

14. The clock generator circuit of claim 12, wherein the random waveform is a pseudo random step-type waveform.

15. The clock generator circuit of claim 12, wherein the periodic waveform generator includes: an up/down counter or a lookup table circuit, wherein the up/down counter generates the periodic waveform according to the second clock signal by counting, or wherein the lookup table circuit generates the periodic waveform according to the second clock signal by referring to a lookup table.

16. The clock generator circuit of claim 12, wherein the first clock signal is the spread spectrum clock signal, which is configured to generate the random waveform in a feedback configuration, wherein the first clock signal and the second clock signal are from different sources which are independent to each other;
wherein the computation unit includes:
- a sampling synchronization circuit, which is configured to operably sample the periodic waveform based upon the first clock signal, so as to generate a sampled periodic waveform, so that the sampled periodic waveform is synchronous with a sampling frequency of the random waveform; and
- a computation subunit, which is configured to operably generate the spread spectrum control signal according to a sum of the sampled periodic waveform plus a signal related to the random waveform.

17. The clock generator circuit of claim 16, wherein:
(1) the computation subunit is configured to operably generate the spread spectrum control signal according to the sum of the sampled periodic waveform plus the random waveform; or (2) the computation unit further includes:
- a sampling control circuit, which is configured to operably sample the random waveform based on a divided frequency, so as to generate a divided-frequency random waveform, wherein the computation subunit is configured to operably generate the spread spectrum control signal according to the sum of the sampled periodic waveform plus the divided-frequency random waveform.

18. The clock generator circuit of claim 16, wherein the computation unit further includes: a frequency divider unit, wherein the computation subunit is configured to operably generate an initial spread spectrum control signal according to a sum of the sampled periodic waveform plus the signal related to the random waveform, wherein the frequency divider unit generates the spread spectrum control signal by dividing a frequency of the initial spread spectrum control signal by m, wherein m is a positive integer.

19. The clock generator circuit of claim 16, wherein the computation unit further includes: a control signal generator, which is configured to operably generate a switching control signal having a random characteristic, and wherein the computation subunit is configured to randomly execute summation or subtraction between the sampled periodic waveform and the signal related to the random waveform according to the switching control signal, to generate a computation result, and the computation subunit is configured to operably generate the spread spectrum control signal according to the computation result.

20. The clock generator circuit of claim 12, wherein the computation unit includes:
- a control signal generator, which is configured to operably generate a switching control signal, wherein the switching control signal has a random characteristic; and
- a computation subunit, which is configured to randomly execute summation or subtraction between the periodic waveform and a signal related to the random waveform according to the switching control signal, to generate a computation result, and wherein the computation subunit is configured to operably generate the spread spectrum control signal according to the computation result.

21. The clock generator circuit of claim 20, wherein the spread spectrum control further includes: a sampling control circuit, which is configured to operably sample the random waveform based on a divided frequency, so as to generate a divided-frequency random waveform, wherein the computation subunit is configured to randomly execute summation or subtraction between the periodic waveform and the divided-frequency random waveform according to the switching control signal, to generate the computation result, and wherein the computation subunit is configured to operably generate the spread spectrum control signal according to the computation result.

22. The clock generator circuit of claim 20, wherein the first clock signal configured to operably generate the random waveform is different and independent from a clock signal configured to operably generate the switching control signal.

23. A clock generation method, which is configured to operably generate a spread spectrum clock signal having a spread spectrum according to a first clock signal and a second clock signal, wherein the spread spectrum clock signal has a fundamental frequency, and wherein under control of the spread spectrum control signal, the spread spectrum clock signal has a switching frequency variation; the clock generation method comprising:

generating a spread spectrum clock signal having a spread spectrum according to a spread spectrum control signal; and generating the spread spectrum control signal according to the first clock signal and the second clock signal;

wherein the step for generating the spread spectrum control signal includes:
- generating a periodic waveform according to the second clock signal;
- generating a random periodic waveform according to the first clock signal; and
- sampling the random waveform and the periodic waveform, so as to compute to generate the spread spectrum control signal.

24. The clock generation method of claim 23, wherein the periodic waveform is a triangular waveform, a sawtooth waveform or a sinusoidal waveform.

25. The clock generation method of claim 23, wherein the random waveform is a pseudo random step-type waveform.

26. The clock generation method of claim 23, wherein the step for generating the periodic waveform includes:
- generating the periodic waveform according to the second clock signal by counting or generating the periodic waveform according to the second clock signal by referring to a lookup table.

27. The clock generation method of claim 23, wherein the first clock signal is the spread spectrum clock signal, which is configured to generate the random waveform in a feedback configuration, wherein the first clock signal and the second clock signal are from different sources which are independent to each other;

wherein the step for generating the spread spectrum control signal includes:
- sampling the periodic waveform based upon the first clock signal, so as to generate a sampled periodic waveform, so that the sampled periodic waveform is synchronous with a sampling frequency of the random waveform; and
- generating the spread spectrum control signal according to a sum of the sampled periodic waveform plus a signal related to the random waveform.

28. The clock generation method of claim 27, wherein:
(1) the spread spectrum control signal is generated according to the sum of the sampled periodic waveform plus the random waveform; or
(2) a divided-frequency random waveform is generated by sampling the random waveform, and the spread spectrum control signal is generated according to the sum of the sampled periodic waveform plus the divided-frequency random waveform.

29. The clock generation method of claim 27, wherein the step for generating the spread spectrum control signal further includes:
- generating an initial spread spectrum control signal according to a sum of the sampled periodic waveform plus the signal related to the random waveform, and generating the spread spectrum control signal through dividing a frequency of the initial spread spectrum control signal by m, wherein m is a positive integer.

30. The clock generation method of claim 27, wherein the step for generating the spread spectrum control signal further includes:
- generating a switching control signal having a random characteristic; and
- executing summation or subtraction between the sampled periodic waveform and the signal related to the random waveform according to the switching control signal, to generate a computation result, and generating the spread spectrum control signal according to the computation result.

31. The clock generation method of claim 23, wherein the step for generating the spread spectrum control signal further includes:
- generating a switching control signal, wherein the switching control signal has a random characteristic; and
- executing summation or subtraction between the periodic waveform and a signal related to the random waveform according to the switching control signal, to generate a computation result, and generating the spread spectrum control signal according to the computation result.

32. The clock generation method of claim 31, wherein the step for generating the spread spectrum control signal further includes:
- sampling the random waveform by a divided frequency, so as to generate a divided-frequency random waveform; and
- randomly executing summation or subtraction between the periodic waveform and the divided-frequency random waveform according to the switching control signal, to generate the computation result, and generating the spread spectrum control signal according to the computation result.

33. The clock generation method of claim 31, wherein the first clock signal configured to operably generate the random waveform is different and independent from a clock signal configured to operably generate the switching control signal.

* * * * *